United States Patent [19]

Flemming

[11] 4,405,898

[45] Sep. 20, 1983

[54] PSEUDO SYNCHRONOUS CLOCKING

[75] Inventor: Donald C. Flemming, Rhinebeck, N.Y.

[73] Assignee: International Business Machines Corporation, Armonk, N.Y.

[21] Appl. No.: 164,380

[22] Filed: Jun. 30, 1980

[51] Int. Cl.³ .......................... H03L 7/06; H03K 5/00
[52] U.S. Cl. ..................................... 328/72; 328/155; 364/900
[58] Field of Search ... 364/200 MS File, 900 MS File; 328/155, 72

[56] References Cited

U.S. PATENT DOCUMENTS 4,021,784  5/1977  Kimlinger ........................ 364/200
4,099,241  7/1978  Ossfeldt .......................... 364/200

*Primary Examiner*—Felix D. Gruber
*Assistant Examiner*—John G. Mills
*Attorney, Agent, or Firm*—James E. Murray

[57] ABSTRACT

Two systems of synchronous logic with dissimilar maximum clocking rate requirements use a single oscillating source to derive pseudo synchronous logic related clock signals having desired mutual properties. The periods of the clock $T_1$ and $T_2$ form the relationship $$S = \frac{T_1}{\alpha} / \frac{T_2}{\alpha}$$

where S is a rational number and $\alpha$ is a largest denominator of $T_1$ and $T_2$. $\alpha$ then can be used to define a window that permits the transfer of data pulses from one of the systems to another without metastable conditions occurring in latch circuits.

9 Claims, 8 Drawing Figures

PSEUDO SYNCHRONOUS CLOCKING

INTRODUCTION

The present invention relates to the transfer of data between interfacing systems of synchronous logic with dissimilar non-harmonic clocking rates. More particularly, it relates to means for avoiding metastability in latches which receive data signals generated in one such interfacing system and clocking signals generated on the other interfacing system.

BACKGROUND OF THE INVENTION

An error condition exists at the interface of two systems of synchronous logic with dissimilar and asynchronous clocking rates because of what is commonly referred to as the metastable latch problem. In a bistable latch where the coincidental occurrence of two pulses is required to change the state of the latch, an anomalous failure mode occurs when the two actuating pulses do not overlap sufficiently to cause the latch to completely switch from one of its stable states to the other. With such insufficient overlap of the two actuating pulses, the output or outputs of the latch do not go to either one of the stable up or down levels but actually perturbate at or around a third level referred to as the metastable level. The metastable level is exactly half way between the up and down levels, and when metastability occurs, the latch outputs either momentarily sit at the metastable level before randomly changing to a stable up or down level or alternatively they oscillate around this metastable level.

In latches actuated by signals from two different logic systems running under different and asynchronous clocking rates, the metastable latch problem arises because the clock pulse of one of the systems overlaps, captures or samples an insufficient portion of the data signal from the other system. It is particularly difficult to correct metastability in the transfer of data between two asychronous systems because the phase of the data signals of each of the two systems is continuously changing with respect to the clock pulses of the other system.

As far as it is caused by differences in clocking rates the metastable latch problem can be solved with known techniques, by running both interfacing systems, from a single clock or two synchronized clocks, at the same clocking rate or at harmonically related clocking rates. However, using the same clocking rate or a harmonic relationship between the two clocking rates is not always a practical solution in any given situation, since it may not allow either system to run anywhere near its optimum operating rate. What is needed is a relationship between the two clocking rates that would allow each of the interfacing systems to approach its maximum performance level while providing the reliable sampling of intersystem logic states.

EMBODIMENT OF THE INVENTION

In accordance with the present invention, the metastable latch problem in interfacing systems operating at different clock rates is simplified by using a single oscillating source to derive both clocks and selecting harmonically unrelated periods of the clocks, $T_1$ and $T_2$, by the following formula:

$$S = \frac{T_1}{\alpha} / \frac{T_2}{\alpha}$$

where S is a rational number and $\alpha$ is the largest common denominator of $T_1$ and $T_2$. $\alpha$ then defines a window that can be set to facilitate the transfer of data pulses from one of the systems to another without the phase variation of the clocks causing metastable conditions in latch circuits actuated by signals from both systems.

Therefore, it is the object of this invention to avoid metastability in latches actuated by concurrent signals from the two interfacing systems of synchronous logic with dissimilar and non-harmonic clocking rates.

It is another object of this invention to provide a highly efficient data interface between two different synchronous logic systems with dissimilar clocking rates.

It is another object of this invention to provide a new nonsynchronous clocking scheme.

THE DRAWINGS

These and other objects of the invention can be better understood from the following description of the preferred embodiment of the invention illustrated in the drawings of which:

DETAILED DESCRIPTION

Figure 1:
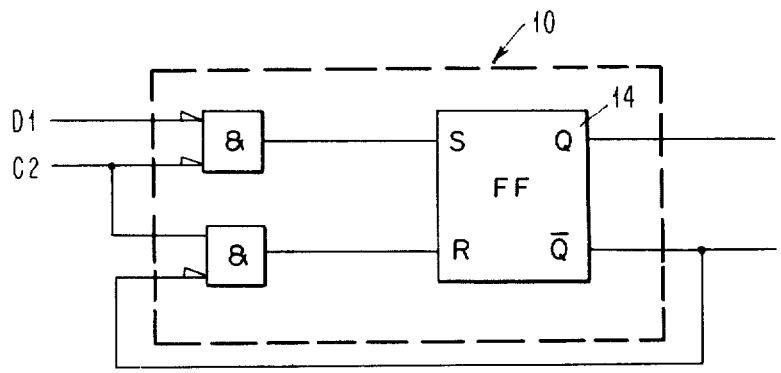
FIG. 1 is a block diagram of a simple latch along with diagrams of input and output pulses of the latch which illustrate the metastable condition.

Referring to FIG. 1, the metastable latch condition occurs in the latch 10 when two pulses $D_1$ and $C_2$, whose coincidental occurrence is necessary for the setting of the state of the latch 10, do not occur with sufficient overlap 12 for the flip flop 14 of the latch to fully switch from one state to another. This causes the latch 10 to drop into what is referred to as the metastable state. In the metastable state, the outputs Q and $\bar{Q}$ of the latch are neither at a stable up (1) or down (0) level but instead both are at a third level half way between the 0 and 1 levels. This third level is undecipherable by other circuits in the system causing an error condition to exist.

As can be seen, when the system clock $C_2$ is rising just as a data signal $D_1$ rises, an insufficient amount of the data signal $D_1$ is sampled during the clock pulse $C_1$ to properly activate the flip flop 14. The flip flop 14 being confused by the signals momentarily drops into the metastable state causing both outputs of the latch to go to a level m half way between the up and down levels of the flip flop. Eventually, the flip flop 14 randomly assumes one of its two stable states which may or may not be the correct stable state. The phasing of the two input pulses, illustrated in FIG. 1, can arise for a number of reasons. However, the reason we are concerned with here is the constant changing in the phase between the two pulses $C_2$ and $D_1$, which occurs when these pulses are from different systems of synchronous logic with dissimilar and asynchronous clocking rates.

One way of eliminating this cause of metastability, with known techniques, involves making the clocking rates of the two systems the same and providing them from a single pulse source or from two synchronized sources. Another approach is to operate one clock at a harmonic frequency of the other and again supply them from a single source or two synchronized sources. However, either of these approaches may not be the best solution in a particular situation.

Figure 2:
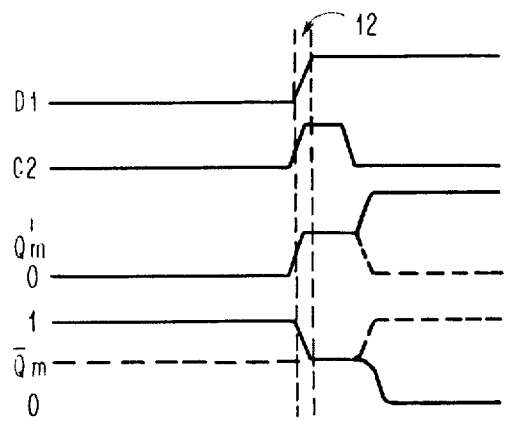
FIG. 2 is a graph illustrating the relationship between a system clock and a subsystem clock in an nonsynchronously operated computer system.

The problem with always using the same or harmonically related clocks can be better understood by reference to FIG. 2 where the numbers along the ordinate represent possible subsystem clock periods $T_2$, while the numbers along the abcissa represent possible system periods $T_1$. Assume now that in the system under discussion, the most efficient and fastest operation of the subsystem is with the period of the subsystem clock set at about 24 nanoseconds, while the most efficient and fastest operation of the system is with the period of the system clock set at about 19 nanoseconds. With these constraints, it is obvious that we can run the system clock at 24 nanoseconds, or in other words the same speed as the subsystem clock, but we could not run the system clock at 12 nanoseconds which would be the first harmonic of the subsystem clock. However, it is possible with the techniques of the present invention to operate the system clock with a period shorter than 24 nanoseconds and longer than 12 nanoseconds without incurring metastability caused by asynchronous operation of the two clocks $T_1$ and $T_2$.

The hatched out area in FIG. 2 defines the concurrence of the acceptable ranges of operation of the two clocks. In accordance with the present invention, the operating periods of the two clocks is selected to be within this region of concurrence along one of the lines S radiating out from the zero point on the graph between the fundamental and first harmonic lines. These radiating lines have a slope, $$S = \frac{T_2}{\alpha} \frac{T_1}{\alpha}$$

where S is a rational number (i.e., $(T_2/\alpha)$ and $(T_1/\alpha)$ are integers) and $\alpha$ is the largest common denominator of $T_1$ and $T_2$ or $$\alpha = \frac{T_2 - T_1}{s_n - s_d}$$

and $S = s_n/s_d$.

Figure 3:
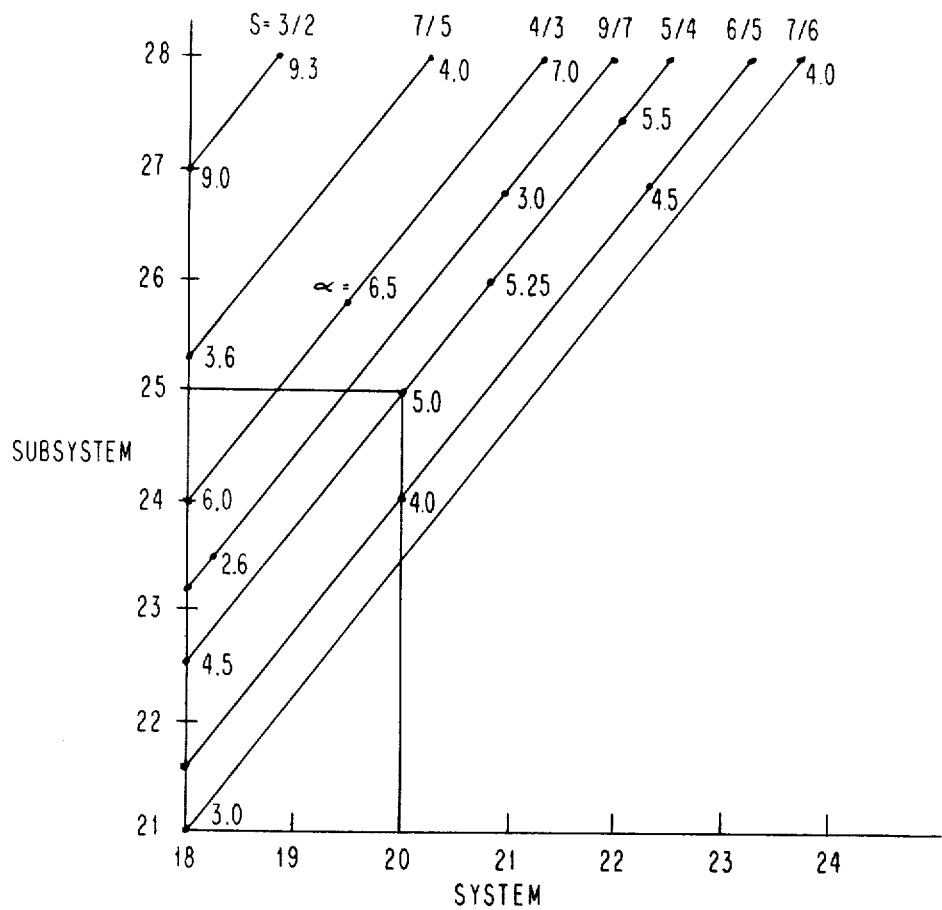
FIG. 3 is a graph showing the hatched square in FIG. 2 in greater detail to illustrate the manner in which nonsynchronous clock rates are selected in accordance with the present invention.

FIG. 3 shows the hatched area in FIG. 2 in more detail with the ratio $T_1/T_2$ shown at the top of each radiating line S and various values of indicated, along each line S. While S is a rational number, there are only a finite number of different pulse phase relationships between $C_1$ and $C_2$ before the relationships repeat themselves. In effect, two pulse trains represented by $C_1$ and $C_2$ precess at the rate of time units per cycle. For any two periods $T_1$ and $T_2$ with an S which is a rational number, the number of such phase relationships, relative to the clock period of interest, $T_n$, is equal to $T_n/\alpha$. As an example, assume that the period of the channel clock is set to be 25 nanoseconds, then in accordance with the present invention, the period of the processor clock is selected from the graph of FIG. 3 to be 20 nanoseconds. By definition, $\alpha$ then would be 5.

Figure 4A:
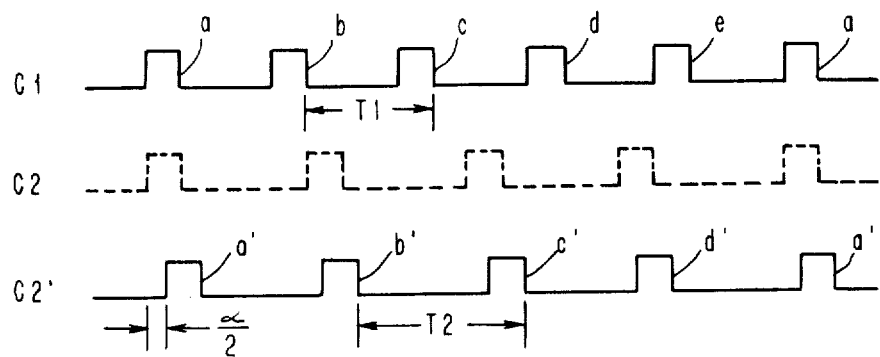
FIGS. 4a to 4c show pulse synchronous and associated waveforms showing desirable mutual properties of the clocks obtained by selecting the clocks in accordance with the present invention.

As shown in FIG. 4a, only four different transition positions of clock $C_2$ can occur during any period of the clock $C_1$. Similarly, there are only five different positions in which the leading edge transition of clock $C_1$ can occur during any period of clock $C_2$. These positions occur at 5 nanosecond intervals meaning that there are 5 nanosecond intervals, or "windows" in which the leading edge transition of one clock pulse will never occur during any given period of the other clock. By delaying one clock by $\alpha/2$ time units with respect to the other, we can move these intervals or windows so they will occur at the time of a critical transition.

$C_2'$ is the waveform for $C_2$, delayed by $\alpha/2 = 2.5$ nanoseconds, such that alignment of the two clock critical (in this case, trailing) edges is avoided for all pulse pair combinations. The relationship between clock pulse sequences repeat every, $T_2/\alpha = 5$ pulses of $C_1$ or $T_1/\alpha = 4$ pulses of $C_2'$ and precession between the pulse trains is at the rate of $\alpha = 5$ nanoseconds per cycle of either clock.

Figure 4B:
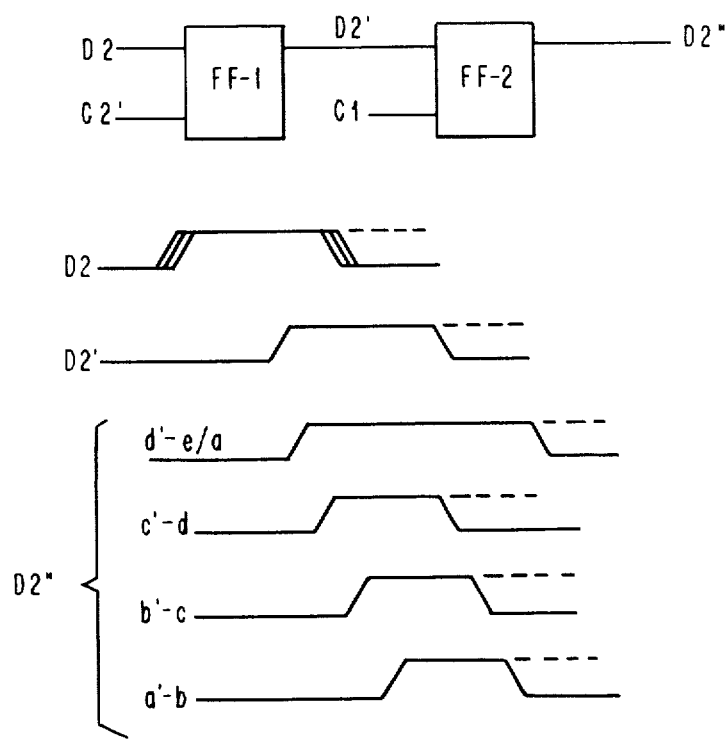

In FIG. 4b, two closely coupled master-slave flip flops, FF-1 and FF-2, are used to transfer data signals ($D_2$) from a system clocked by $C_2'$ to a system clocked by $C_1$. The flip flops FF1 and FF-2 are of the type shown in FIG. 9.21 and described beginning on page 233 of a book entitled "Introduction to Switching Theory & Logical Design", Second Edition, by Fredrick J. Hill and Gerald R. Peterson, published by John Wiley & Son, New York in 1974. These flip-flops are designed for trailing edge actuation between master and slave sections. Edge actuation flip flops such as the master slave flip flop are used to avoid metastability problems with other combinations of critical edges than those aligned in accordance with the present invention. Signal $D_2$ may arrive at FF-1 anytime during a $C_2$ cycle and may persist for one or more of the $C_2$ cycles. At the output of FF-1, $D_2$ has been retimed to one of the critical edges of $C_2'$ (a', b', etc. . . . ) such that transitions of $D_2'$ are not coincident with critical edges of $C_1$ (a, b, etc. . . . ). Thus, after $D_2'$ is retimed in FF-2 by $C_1$, $D_2''$ is generated at one of the times shown depending on which $C_1$ pulse samples $D_2'$. In the case where $C_1$ edge 'e' performs the sampling, edge 'a' will resample the same $D_2'$ signal one $C_1$ cycle later, resulting in the two cycle minimum output pulse shown. Transfers conducted by all other combinations of edge pairs will result in one cycle minimum pulses out, as shown.

Figure 4C:
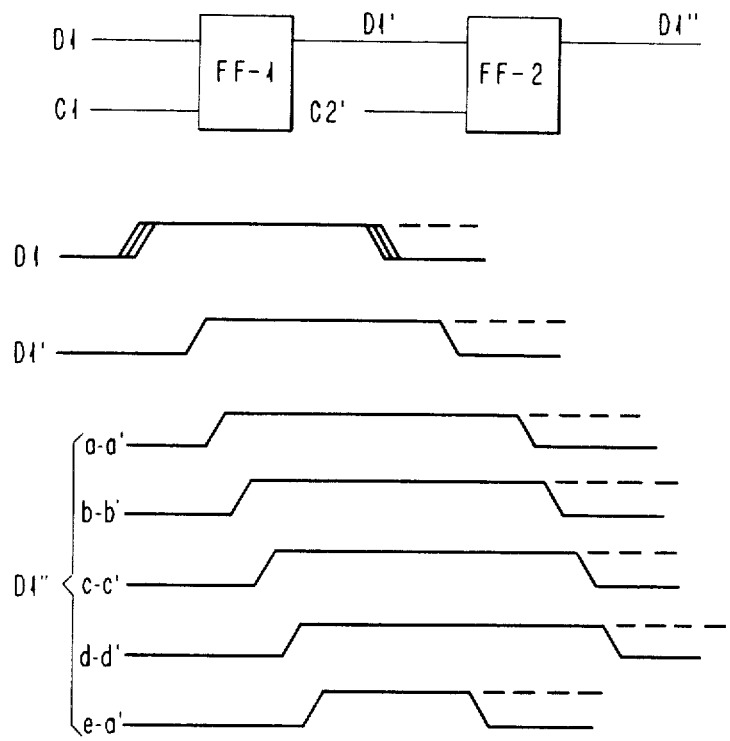

FIG. 4(c) shows corresponding relationships for transfers from a system clocked by $C_1$ to a system clocked by $C_2$. Since $C_2$ has a longer period than $C_1$, oversampling of $D_1'$ is not possible, but undersampling would occur if a one cycle $D_1'$ pulse were to arrive between $C_1$ edges 'e' and 'a'. To prevent missing this event, all $D_1$ pulses must have a minimum width of two cycles. Then $D_1''$ will be two cycles minimum duration except for an input pulse rising with edge 'e'. This will not be sampled by $C_2'$ until edge 'a' arrives, resulting in the one cycle output pulse shown.

Figure 5:
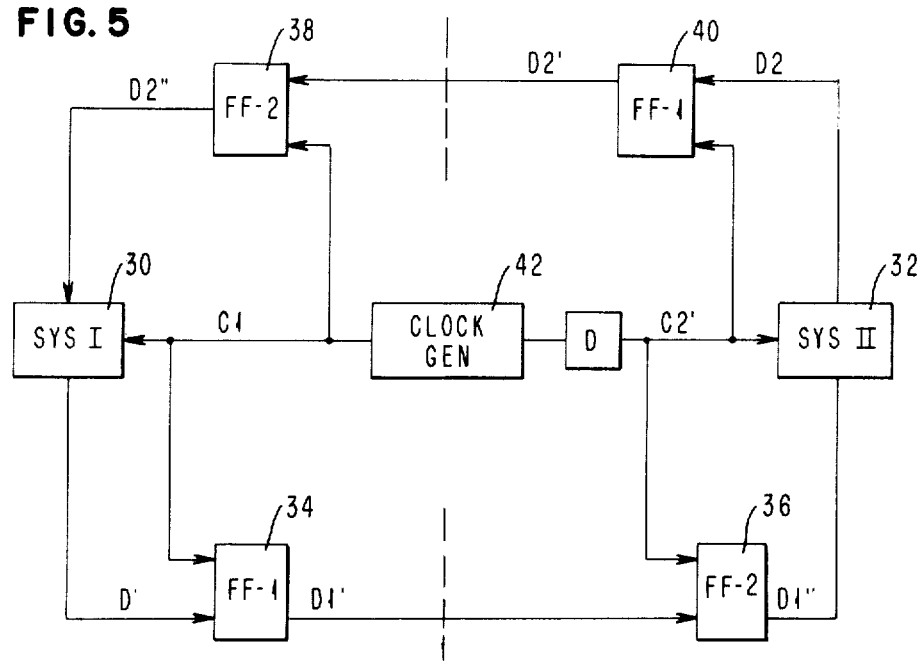
FIG. 5 is a schematic diagram computer system using the clocking scheme of the present invention.

In FIG. 5, a synchronizer is shown for transferring clocked data bits back and forth between the processor 30 and the channel 32 one bit at a time. The synchronizer is formed of the two sequences of the type discussed in connection with FIG. 4 in each direction making a total of four clocked master slave flip flops 34 to 40. Each of these flip flops receives a data signal from one of the other of the systems, and a clock pulse from a clock generator 42, which will be described hereinafter. Transmission delays of various amounts are involved in the transmission of the clock pulses and the data registers. These delays must be taken into account to avoid metastability due to these delays. However, some compensation on such delays is well known in the prior art. They are disregarded here for simplicity and understanding of the present invention.

Assume we have the situation described in FIG. 1, where the data signal $D_1$ is being transmitted from system 1 or the processor to system 2 or the channel. Then the data signal D, in FIG. 5 is fed into a first latch 34 along with the clock $C_1$ to set the latch 34 and the clock $C_1$ is used to reset the latch. The trailing edge of the output pulse $D_1$ of latch 34 is therefore fixed to coincide with the trailing edge of the clock pulse $C_1$. The output pulse $D_1$ is fed to the input of latch 36 along with the clock $C_2'$, where the phasing at the inputs is set to be as previously described and shown in FIG. 4 by the relationship between curves $D_1$ and $C_2'$.

In the real systems of course, the window would not actually be a full 5 nanoseconds. Consideration must be given to deviations in the occurrences of the pulses from system to system because of manufacturing tolerances and within each system depending on design and implementation options.

Figure 6:
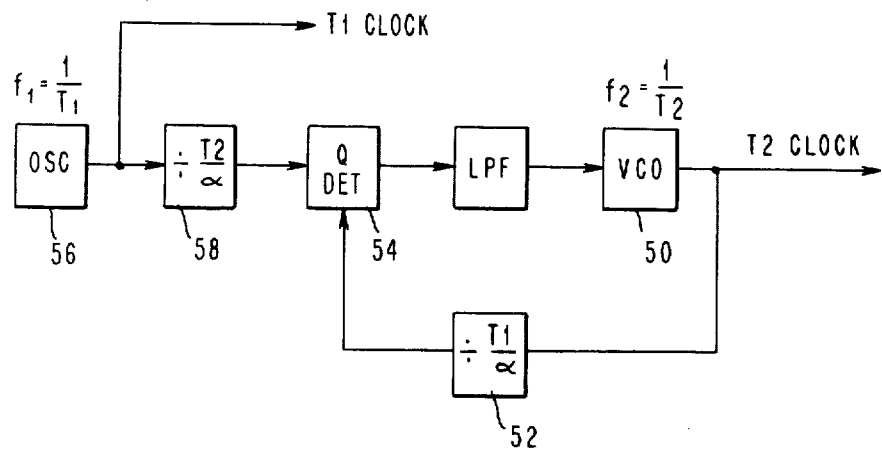
FIG. 6 is a block diagram of the phase lock loop system for generating two clocks in accordance with the present invention.

The clock generator 42 in FIG. 5 is shown in more detail in FIG. 6. As can be seen, it contains a phase lock loop. The function of the phase lock loop is to provide a phase and frequency relationship between clock pulses $C_1$ and $C_2$ for the processor and channel systems respectively. The phase lock loop consists of four basic components, the voltage controlled oscillator 50, the frequency divider 52, phase frequency comparator 54 and a low pass filter. The input to the phase lock loop is from an oscillator 56 which generates the clock signal $C_1$ for the processor. The frequency of oscillation of the oscillator is set at $F_1 = 1/T_1$. The output of the oscillator is divided by $T_2/\alpha$ in divider 58 before being fed to the phase/frequency comparator 54. The frequency phase comparator 54 compares the output of divider circuit 58 with the output of divider circuit 52 which divides the output of the voltage controlled oscillator 50 by $T_1/\alpha$. This is to determine if the voltage controlled oscillator 50 is tracking the oscillator 56. This is done by comparing the positive transition of circuit 58 to the positive transition of the frequency divider 52. If the reference is early, the output of the comparator 54 switches to a down level. If the reference is late, the output goes to a high level. The filter smoothes out the comparator output so that the output frequency of the voltage controlled oscillator only follows long term changes in the reference signal phase. The output of the voltage controlled oscillator is the channel clock $C_2$.

Above, we have described one embodiment of the invention. In this embodiment, the two periods $T_1$ and $T_2$ were fairly arbitrarily selected. However, in real applications, other considerations could put constraints on the values that can be selected.

Generation of the time of day clock requires that the value of the system clock $C_1$ be set at specific values, one of which may or may not be 20 nanoseconds. In any case, it is quite easy to change the system clock $C_1$ from 20 nanoseconds to say 20.94 nanoseconds as required by the time of day clock, and then select a channel clock of 26.18 nanoseconds instead of 25 nanoseconds and still obtain full advantage of the present invention. Therefore, it should be understood that while a single embodiment of the invention has been described, many changes in this embodiment can be made without departing from the spirit and scope of the invention, as set forth in the claims attached hereto.

Having thus described my invention, what I claim as new, and desire to secure by Letters Patent is:

1. In a computer system in which data is transmitted across an interface between parts of the computer under the control of separate clocks operated at different frequencies, the method comprising:

operating the two clocks at two mutually non-harmonic frequencies whose periods $T_1$ and $T_2$ form a ratio $$S = \frac{T_2/\alpha}{T_1/\alpha}$$

that is a rational number so that there is a limited number of different phase relationships between sets of critical transitions in the pulses of the two clocks where $\alpha$ is the largest common denominator of the periods $T_1$ and $T_2$ in the ratio S offsetting the occurrence of one set of critical sets of transitions of said two clock pulses by an amount less than $T_{n/\alpha}$ whereby metastability is prevented from occurring as a result of use of mutually non-harmonic frequencies in the two clocks.

2. The computer system of claim 1 wherein the first step of the method is accomplished by means of a phase lock loop means synchronizing one of said frequencies to the other.

3. The computer system of claim 2 wherein the second step of the method is accomplished by a delay outside said phase lock loop that offsets the selected transitions.

4. The computer system of claim 2 wherein the second step of the method is accomplished by a delay inside said phase lock loop that offsets the selected transitions.

5. In a computer system in which data generated using one clock operated at one frequency is transmitted across an interface to part of the computer operated under the control of a separate clock with a different operating frequency, the method comprising:

operating the two clocks at two unequal and mutually non-harmonic frequencies whose periods $T_1$ and $T_2$ form a ratio $S = (T_2/T_2)$ that is a rational number so that there is a limited number different phase relationships between critical transitions in sets pulses of the two clocks, synchronizing clock pulses using bistable edge triggered synchronization means in said interface which receives data generated using said one clock and synchronizes it to clock pulses derived from said separate clock, offsetting the occurrence of one critical transition relative to the other in one set of pulses of said sets of pulses by an amount sufficient to prevent metastability from occurring in said edge triggered synchronization means as a result of the transitions in said one set but less than $T_{2/\alpha}$ where $\alpha$ is the largest common denominator of $T_1$ and $T_2$ whereby metastability resulting from using two mutually nonharmonic frequencies is prevented from occuring in said bistable edge triggered synchronization means for all said sets of pulses.

6. The computer system of claim 5 wherein the step of a synchronizing user a bistable edge triggered synchronization means that includes two closely positioned flip-flop means said first flip-flop means receiving said data pulses and clock pulses from said one clock and said second flip-flop means receiving the output of the first flip-flop means and said clock pulses from said separate clock.

7. The computer system of claim 5 wherein the step of operating the two clocks involves a phase lock loop means synchronizing one of said frequencies to the other.

8. The computer system of claim 6 wherein said second the step of synchronizing clock pulses is accomplished by using a delay outside said phase lock loop that offsets the selected transitions.

9. The computer system of claim 6 wherein the step of synchronizing clock pulses is accomplished by using a delay inside said phase lock loop that offsets the selected transitions.

* * * * *

UNITED STATES PATENT AND TRADEMARK OFFICE
CERTIFICATE OF CORRECTION

PATENT NO. : 4,405,898

DATED : September 20, 1983

INVENTOR(S) : Donald C. Flemming

It is certified that error appears in the above-identified patent and that said Letters Patent are hereby corrected as shown below:

Column 6, line 57, change "$(T_2/T_2)$" to --$(T_2/T_1)$--.

Column 7, line 11, delete "a"; change "user" to --using--.

Column 8, lines 7 and 8, delete "said second".

Signed and Sealed this

*Fifth* Day of *February 1985*

[SEAL]

*Attest:*

DONALD J. QUIGG

*Attesting Officer*     *Acting Commissioner of Patents and Trademarks*